(12) United States Patent
Shroff et al.

(10) Patent No.: US 7,491,630 B2
(45) Date of Patent: Feb. 17, 2009

(54) UNDOPED GATE POLY INTEGRATION FOR IMPROVED GATE PATTERNING AND COBALT SILICIDE EXTENDIBILITY

(75) Inventors: Mehul D. Shroff, Austin, TX (US); Paul A. Grudowski, Austin, TX (US); Mark D. Hall, Austin, TX (US); Tab A. Stephens, Buda, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 314 days.

(21) Appl. No.: 11/375,768

(22) Filed: Mar. 15, 2006

(65) Prior Publication Data

US 2007/0218661 A1  Sep. 20, 2007

(51) Int. Cl.
*H01L 21/04* (2006.01)
(52) U.S. Cl. .............................. 438/510; 257/E21.473
(58) Field of Classification Search ................. 438/510; 257/E21.473
See application file for complete search history.

(56) References Cited

U.S. PATENT DOCUMENTS

| | | | |
|---|---|---|---|
| 4,561,907 A | 12/1985 | Raicu | 148/1.5 |
| 4,984,043 A | 1/1991 | Vinal | 357/23.14 |
| 5,933,721 A * | 8/1999 | Hause et al. | 438/217 |
| 2007/0196988 A1 * | 8/2007 | Shroff et al. | 438/299 |

OTHER PUBLICATIONS

J. Pfiester et al., "A TiN Strapped Polysilicon Gate Cobalt Salicide CMOS Process," IEEE 1990, IEDM 90-241-244.
J. Hayden et al., "A High-Performance Sub-Half Micron CMOS Technology for Fast SRAMs," IEEE 1989, IEDM 89 417-420.
R. Jones et al., "Use of Screening and Response Surface Experimental Designs for Development of a 0.5-µm CMOS Self-Aligned Titanium Silicide Process," IEEE Transactions on Semiconductor Manufacturing, vol. 4, No. 4, Nov. 1991, pp. 281-287.

* cited by examiner

*Primary Examiner*—Bradley K Smith
(74) *Attorney, Agent, or Firm*—Hamilton & Terrile, LLP; Michael Rocco Cannatti

(57) ABSTRACT

A semiconductor process and apparatus uses a predetermined sequence of patterning and etching steps to etch an intrinsic polysilicon layer (26) formed over a substrate (11), thereby forming etched gates (62, 64) having vertical sidewall profiles (61, 63). While a blanket nitrogen implant (46) of the intrinsic polysilicon layer (26) may occur prior to gate etch, more idealized vertical gate sidewall profiles (61, 63) are obtained by fully doping the gates (80, 100) during the source/drain implantation steps (71, 77, 91, 97) and after the gate etch.

20 Claims, 7 Drawing Sheets

UNDOPED GATE POLY INTEGRATION FOR IMPROVED GATE PATTERNING AND COBALT SILICIDE EXTENDIBILITY

BACKGROUND OF THE INVENTION

1. Field of the Invention

The present invention is directed in general to the field of semiconductor devices. In one aspect, the present invention relates to controlling the profile of semiconductor features in semiconductor devices.

2. Description of the Related Art

As semiconductor device sizes are scaled down, the requirements for device design and fabrication continue to be tightened in order to fit more circuitry on smaller chips. As device sizes shrink, increasingly complex etch processes are used to define semiconductor device features, such as polysilicon gates. For example, a typical gate patterning process may use several steps after the doped polysilicon layer is formed and the photoresist ("PR") is patterned, including a PR trim step (to shrink the size of the features being transferred), a hard mask etch step (which uses the PR as a mask), an ARC etch step (which uses the hard mask as a mask), a preliminary cleaning step (which includes some etching action), a break through etch step (to remove oxide and begin the poly etch), a main poly etch step (which can leave some poly on dielectric outside gate), a soft landing etch step, an overetch step (to remove all remaining undesired polysilicon) and a sidewall clean etch step (which etches sidewalls and potentially gouges the silicon substrate). TEOS (tetra ethyl ortho silicate) or silicon nitride may be used as a hard mask. Silicon nitride or amorphous carbon may be used as the ARC layer. Each type of processing may contribute separately to the etching of the polysilicon gate, making it difficult to control the vertical profiles of polysilicon gates. These etch and clean steps—in conjunction with doping, nitrogen implant (for PMOS gates) and implant damage—result in an irregular gate profile that, in many cases, deviates substantially from the ideal vertical sidewall. For example, the gate can have an "hourglass" shape, a "coke-bottle" shape, or can display a "foot" or notches (aka "mouse bites") at the bottom and in some cases at the top of the gate. This is shown in FIG. 1 which illustrates examples of various device feature profiles 2-6 formed over a first layer 8 (e.g., an unetched gate oxide) and substrate 7, including an idealized gate profile 2, an hourglass gate profile 3, a gate profile 4 having notches on the top, a gate profile 5 having foot extensions on the bottom, and a gate profile 6 having notches on the bottom. Such irregular or non-vertical sidewalls can adversely affect gate dimension control, short channel effect (SCE) control, and silicidation robustness, thereby negatively impacting circuit performance and yield.

Accordingly, a need exists for a semiconductor manufacturing process which provides better control of the sidewall profile on semiconductor device features, such as gate electrodes. In addition, there is a need for a fabrication process which forms a gate where hour-glassing, notches and/or mouse bites in the gate sidewall are reduced or eliminated. A gate electrode formation process is also needed that improves circuit performance and yield by improving gate dimension control, short channel effect (SCE) control, and silicidation robustness. There is also a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
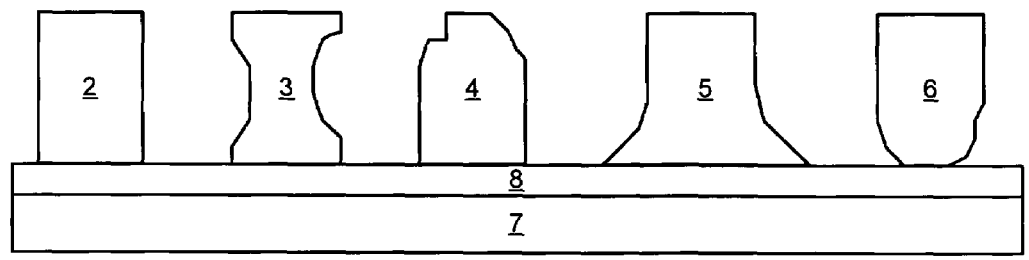
FIG. 1 is a cross-sectional illustration of various polysilicon gate profiles that are caused by different gate patterning processes.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating a silicon-based device feature, such as a transistor gate or a fin of a FinFET device, by etching an undoped polysilicon layer to form etched gate electrode structures having improved, more vertical sidewall profiles, and then subsequently doping the etched gate electrode structures during implantation of the source/drain regions. In this embodiment where undoped poly is etched, any differences between the gate etch profiles for N-doped Poly gates and P-doped Poly gates is eliminated. In another embodiment, an implant species (e.g., nitrogen) may be implanted in all or part of the undoped polysilicon layer prior to gate etch which is tuned to reduce or eliminate hour-glassing associated with nitrogen-doped polysilicon profiles. In yet another embodiment, the implant species may be implanted after forming sidewall spacers on etched gate electrode structures from undoped polysilicon, in which case the subsequent doping of the etched gate electrode structures and source/drain regions can be tuned to account for the presence of the implant species in the source/drain region. In addition or in the alternative, the polysilicon layer outside of the core transistor device area (e.g., where poly resistors or I/O transistors are formed) may be selectively doped prior to gate etch by masking the polysilicon layer in the core transistor device area since the dimensions of devices outside the core transistor area, such as poly resistors or I/O devices, are typically much larger and hence, profile and dimension control are less critical. By etching the gate electrode structures in the core transistor device area prior to completion of gate doping, the etched gates have improved, more vertical profiles, since profile differences as a result of the interactions between gate etching processes and the dopant species are eliminated. Alternatively, with the use of an implant species (such as nitrogen, xenon, germanium, etc.), the etch process can be optimized to provide substantially vertical profiles, and profile differences between N-doped and P-doped gates can be eliminated. These approaches also allow precise tuning of gate dimensions (for example, if a bias between P-type and N-type gates is needed), since doping-induced profile differences resulting in dimension differences and variability are not a factor.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention.

Figure 2:
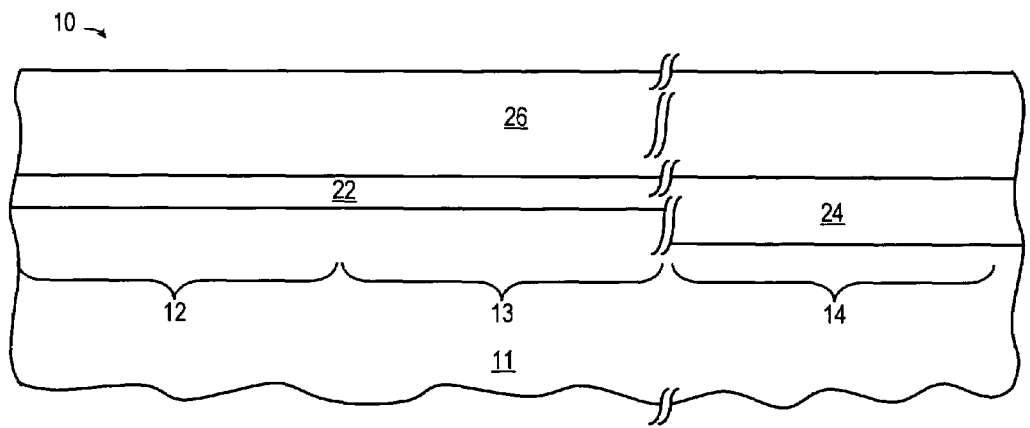
FIG. 2 is a partial cross-sectional view of a semiconductor structure including a substrate, one or more dielectric layers and an unetched gate stack formed with a layer of undoped or intrinsic polysilicon in one embodiment of the invention.

Turning now to FIG. 2, a partial cross-sectional view is depicted of a semiconductor structure 10, including a substrate 11, one or more dielectric layers 22, 24 and an unetched gate stack 26 formed at least in part with a layer of undoped or intrinsic polysilicon, silicon germanium or any other type of single crystal silicon, amorphous silicon, polycrystalline silicon or a combination of any one or more of the foregoing. Depending on the type of device being fabricated, the substrate 11 may be implemented as a bulk silicon substrate, monocrystalline silicon (doped or undoped), or any semiconductor material including, for example, Si, SiC, SiGe, SiGeC, Ge, GaAs, InAs, InP as well as other Group III-IV compound semiconductors or any combination thereof, and may be formed as the bulk handling wafer. In addition, the substrate 11 may be implemented as the top silicon layer of a silicon-on-insulator (SOI) structure. Prior to forming the unetched gate stack 26, an insulator or dielectric layer 22 is formed in a core device area 12, 13 by depositing or growing an insulator or high-k dielectric (e.g., silicon dioxide, oxynitride, metal-oxide, nitride, etc.) over the semiconductor substrate 11 using chemical vapor deposition (CVD), plasma-enhanced chemical vapor deposition (PECVD), physical vapor deposition (PVD), atomic layer deposition (ALD), thermal oxidation, or any combination(s) of the above to a thickness of approximately 5-200 Angstroms, though a thinner or thicker layer may also be used. In addition, a second dielectric layer 24 (e.g., a field oxide, shallow trench isolation region or gate dielectric for non-core transistor devices) may be formed in another device area 14 by CVD, PECVD, PVD, ALD, thermal growth or any combination(s) thereof. As for the unetched gate stack 26, at least a first undoped or intrinsic polysilicon layer is formed or blanket deposited over the dielectric layers 22, 24 by CVD, PECVD, PVD, ALD, or any combination(s) thereof to a thickness of approximately 500-2000 Angstroms, though a thinner or thicker layer may also be used. As will be appreciated, the unetched gate stack 26 is formed to cover the entire top surface of the semiconductor structure 10, including the first, second and third circuit areas 12, 13, 14. The unetched gate stack 26 may be formed with amorphous silicon material, and may include one or more conductive layers (e.g., metal, silicide or the like).

Figure 3:
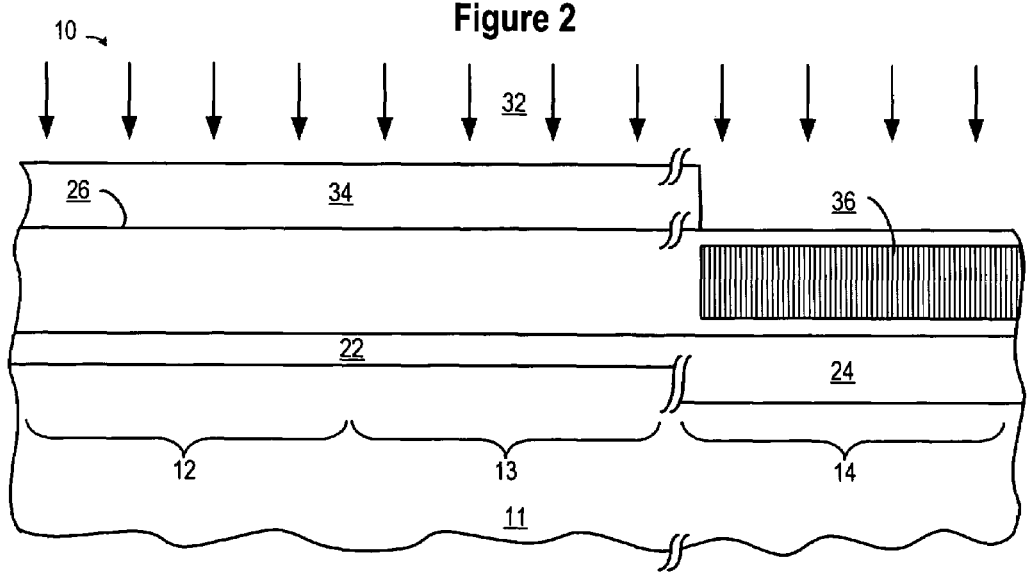
FIG. 3 illustrates processing subsequent to FIG. 2 after a mask is formed to expose the unetched gate stack in a predetermined circuit area for non-core devices or non-critical dimension/min feature size devices and implant the predetermined circuit area with a predetermined dopant species.

FIG. 3 illustrates processing of the semiconductor structure 10 subsequent to FIG. 2 after a mask 34 is formed to expose the unetched gate stack 26 in a predetermined circuit area 14 (e.g., where non-core devices or non-critical dimension/minimum feature size devices will be located) which is implanted with a predetermined species 32, such as a dopant or a non-dopant species, such as nitrogen. As a preliminary matter, any desired patterning and etch sequence may be used to form the first mask 34 over the first and second circuit areas 12, 13, including but not limited to depositing, patterning, etching or developing a photoresist or hard mask layer. With the mask 34 in place, the doping implantation 32 may be used to implant polysilicon device features located outside of the core transistor device area 12, 13, such as setting polysilicon resistors formed over the field oxide 24, or may be used to implant non-core transistor gate electrode layers, such as used in I/O transistor devices which, because of their larger size, are not as sensitive to profile and dimension control concerns. Thus, while the figures depict a device layer in the predetermined circuit area 14 as being formed over a field oxide 24, it will be appreciated that other devices (such as non-core transistor gate electrode layers) will be formed over a gate dielectric layer (not shown). In such cases where sidewall gate profile control is not as important, the predetermined implant species 32 (e.g., nitrogen, boron, phosphorus, arsenic, etc.) implanted into the gate stack polysilicon layer 26 over the third predetermined circuit area 14 will depend on what type of device is being formed. Depending on the implant conditions, the concentration profile of the predetermined implant species 32 will create a region 36 at a predetermined depth in the gate stack polysilicon layer 26 in which the concentration of the predetermined implant species peaks. Though the specific implant conditions may be selected depending on the thickness of the polysilicon layer 26, a selected example dopes the polysilicon layer 26 used to form unsilicided poly resistors with phosphorus implanted at approximately 5-25 keV energy having a dose of approximately $5\times10^{14}$ to $5\times10^{16}$ $cm^{-2}$.

Figure 4:
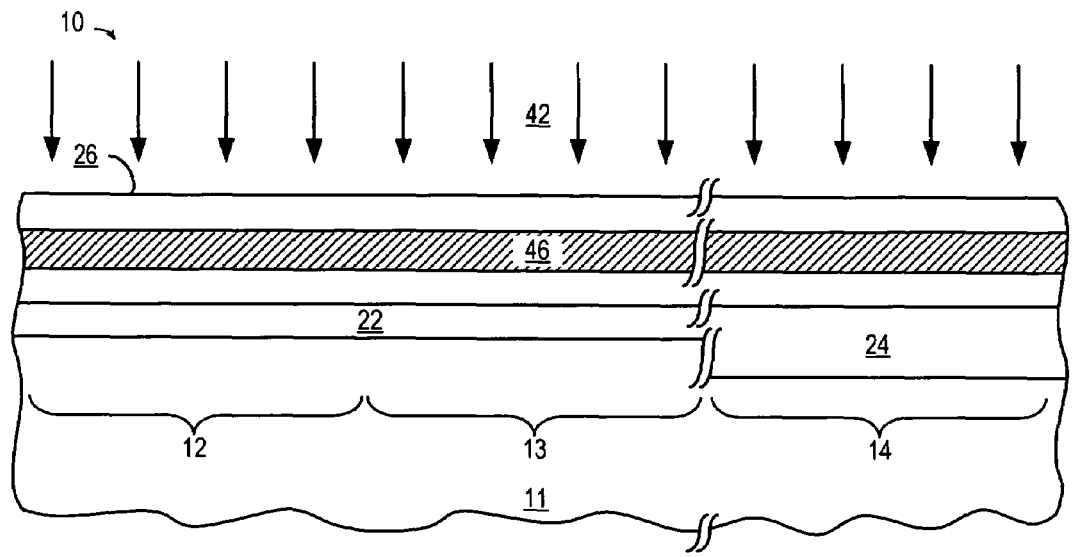
FIG. 4 illustrates processing subsequent to FIG. 2 after the unetched gate stack is implanted with an implant species, such as nitrogen, in accordance with selected alternative embodiments of the present invention.

FIG. 4 illustrates processing of the semiconductor structure 10 subsequent to FIG. 2 after the unetched gate stack 26 is implanted with an implant species 42, such as nitrogen, in accordance with selected alternative embodiments of the present invention. While an implant mask (not shown) may be formed prior to nitrogen implantation, in various embodiments of the present invention, the entirety of the gate stack polysilicon layer 26 is implanted with the implant species without a mask being in place. In a selected embodiment, the gate stack polysilicon layer 26 is blanket doped with nitrogen. In accordance with various alternative embodiments, the nitrogen implant is not done or is implanted in only selected regions. For example, by using a mask (not shown) to cover the third circuit area 14, nitrogen may be implanted only into key devices (e.g., NMOS and PMOS core devices) formed in the first or second circuit area 12, 13 in order to make their dopant profile uniform and thus eliminate profile differences. One advantage of implanting nitrogen into the polysilicon layer 26 where p-poly will subsequently be formed is that boron diffusion will be significantly retarded, thereby preventing boron penetration into gate oxide and into the channel, and the resultant increase in gate leakage, degradation in gate oxide integrity, and reduction in threshold voltage. Alternatively, by using a mask (not shown) to expose the third circuit area 14, nitrogen may be implanted into non-core devices (e.g., I/O devices) formed in the third circuit area 14 which would benefit from the boundary-stuffing properties of implanted nitrogen. Depending on the implant conditions, the concentration profile of the implanted species 42 will create a region 46 at a predetermined depth in the gate stack polysilicon layer 26 in which the implant species concentration peaks. In a selected embodiment, the nitrogen 42 is implanted with an implant energy of approximately 10-20 keV and a dosage of approximately $5\times10^{14}$ to $1\times10^{16}$ $cm^{-2}$, though other implant energies and dosages may be used, depending on the thickness of the polysilicon layer. Of course, other implant materials 32 may be used as a diffusion retardation species, such as xenon, germanium, etc. As implanted, the peak nitrogen concentration depth may be located at or below the middle of the gate stack polysilicon layer 26 to help prevent boron penetration into the gate dielectric layer 22. For example, in a polysilicon layer that is 1000 Angstroms thick, the peak nitrogen concentration is located at least 500 Angstroms below the upper surface of the polysilicon layer. However, due to the distributed nature of the nitrogen implant profile, the peak nitrogen concentration region 46 may be located at any depth in the gate stack polysilicon layer 26 and still reduce boron penetration. However, it will be appreciated that the nitrogen implantation 42 is a step that need not necessarily be included in the fabrication sequence of some embodiments. Alternatively, the nitrogen implantation 42 may be only selectively applied to predetermined circuit areas of the gate stack polysilicon layer 26 (e.g., in the circuit area 12 where the p-type poly region is subsequently formed).

Figure 5:
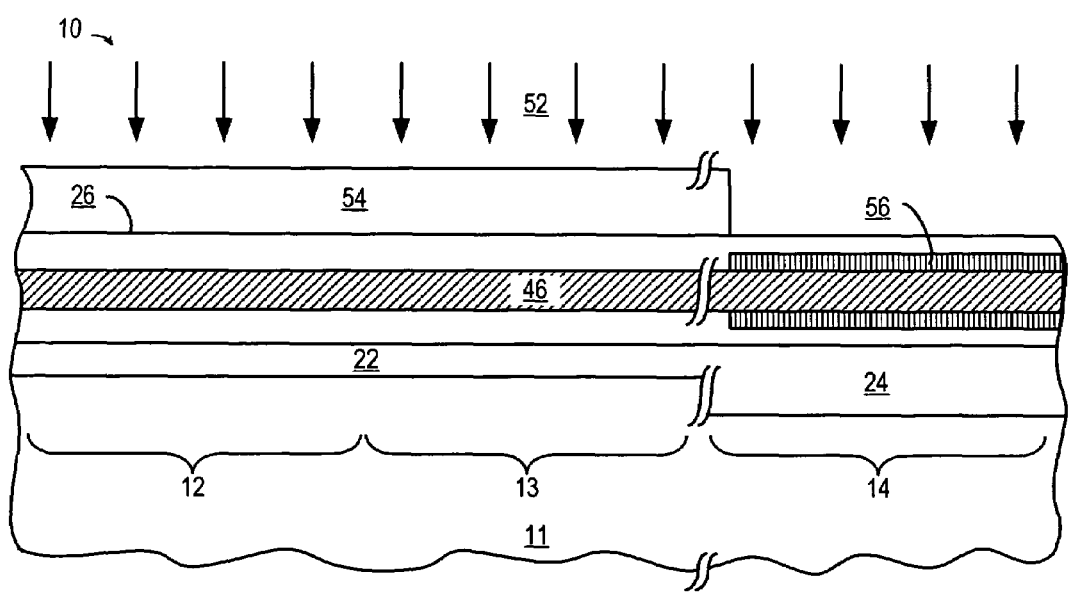
FIG. 5 illustrates processing subsequent to FIG. 4 after a mask is formed to expose the unetched gate stack in a circuit area for non-core devices which is implanted with a predetermined dopant species.

FIG. 5 illustrates processing of the semiconductor structure 10 subsequent to FIG. 4 after a mask 54 is formed to expose the unetched gate stack in a predetermined circuit area 14 (e.g., where non-core devices will be located) which is selectively implanted with a predetermined dopant species 52. Again, any desired patterning and etch sequence may be used to form the first mask 54 over the first and second circuit areas 12, 13, and depending on the implant conditions, the concentration profile of the implanted species 52 will create a region 56 at a predetermined depth in the gate stack polysilicon layer 26 in which the implanted dopant concentration peaks, where the implanted region 56 may be used to set unsilicided poly resistors formed in the third circuit area 14 and/or may be used to dope non-core transistor gate electrode layers.

When the gate stack 26 is formed with undoped polysilicon and no nitrogen is implanted (such as depicted in FIGS. 2-3), then any desired gate patterning process may be used to form etched gate electrode structures with vertical sidewall profiles, and there is no need to modify the etch process to account for hour-glassing. Alternatively, when the gate stack 26 is formed with undoped polysilicon and implanted nitrogen (such as depicted in FIGS. 4-5), the presence of the implanted nitrogen 46 (which helps reduce or prevent boron penetration into the gate dielectric layer 22 in the finally completed device) can also adversely impact the sidewall profile of the subsequently etched gate electrode structures, resulting in irregular (e.g., hourglass-shaped) sidewall profiles. The profile effects of the implanted nitrogen can be reduced or eliminated by inserting a spike anneal and/or rapid thermal anneal (RTA) process that heats the semiconductor structure 10 to a relatively moderate temperature for a short time (e.g., approximately 700-1100° C. for between 5-60 seconds). In other applications where the effects of nitrogen implanted into the polysilicon in the core circuit area dominate, the subsequent gate etch process may then be optimized to provide substantially vertical gate profiles for key devices. In an illustrative embodiment, the modified gate etch process is an anisotropic etch process chemistry that is optimized to reduce hour-glassing associated with nitrogen-implanted polysilicon profiles by modifying the chamber flow parameters for the poly main etch to increase the $O_2$ flow—e.g., from 16 sccm of $HeO_2$ (30% $O_2$) to 10 sccm of $O_2$—and decrease the $CF_4$ flow—e.g., from 30 sccm to 10 sccm. In other embodiments, the anisotropic etch process chemistry is configured to flow between about 8 sccm and 12 sccm of $O_2$ and between about 8 sccm and 12 sccm of $CF_4$ into a processing chamber. The modified poly etch process results in improved profiles on the PMOS gate structures by removing or reducing the hour-glassing at the sidewall. The effect of the modified poly etch on PMOS and NMOS gate structures that are both implanted with nitrogen prior to gate etch is that both PMOS and NMOS gate structures should have the same straight vertical sidewall profile. However, if the modified poly etch is applied to etch NMOS gate structures that have not been implanted with nitrogen, the effect is to widen the NMOS gate structures in the middle of the sidewall profile.

Figure 6:
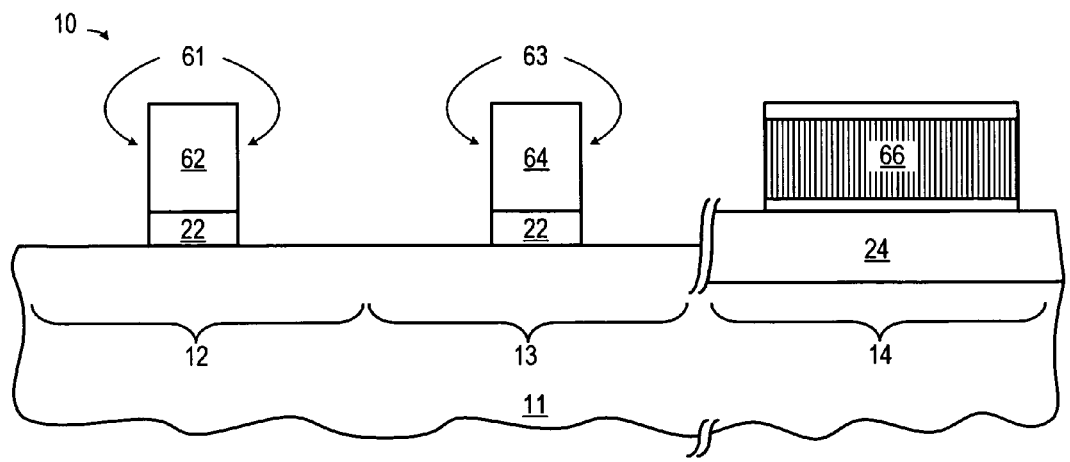
FIG. 6 illustrates processing subsequent to FIG. 2-5 after the gate stack is etched to form core gate electrode structures having vertical sidewall profiles at the same time that other polysilicon-based device features are formed.

In either case, the result of the vertical gate etch process is depicted in FIG. 6, which illustrates processing of the semiconductor structure 10 subsequent to FIG. 2, 3, 4 or 5 (depending on which if any of the optional implantation steps are performed) after the gate stack 26 is etched to form core gate electrode structures 62, 64 having vertical sidewall profiles 61, 63 at the same time that other polysilicon-based device features 66 are formed. For gate stacks formed with intrinsic poly, any desired gate patterning and etch sequence may be used to form the etched gate stack structures 62, 64, 66, including but not limited to photoresist trim, photoresist or a hard mask formation, hard mask etch (using the photoresist as a mask), anti-reflective coating (ARC) etch (using the remnant hard mask as a mask), pre-etch cleaning, oxide break through, main poly plasma etch, soft landing etch, poly clean overetch, and post-etch cleaning. For gate stacks formed with intrinsic poly and implanted nitrogen, an anisotropic etch process chemistry may be used which is optimized to reduce hour-glassing associated with nitrogen-implanted polysilicon profiles. As depicted, the etched gate electrode structure 62 in the first circuit area 12 may be used to form core PMOS transistors in the completed device, the etched gate electrode structure 64 in the second circuit area 13 may be used to form core NMOS transistors in the completed device, and the etched gate structure 66 in the third circuit area 14 may be used to form resistors or non-core transistors and devices in the completed device.

As a result of etching a gate stack 26 in the core areas 12, 13 that is undoped (or at best, nitrogen doped), the selectively etched core gate electrode structures 62, 64 have sidewalls 61, 63 that are vertical or at least substantially vertical as compared to etched polysilicon layers that are fully pre-doped. In this way, the doping-based differences between the n-type poly and p-type poly that can separately and/or deleteriously affect the gate etch profiles for the NMOS and PMOS gates are eliminated or at least reduced. In other words, there is no difference between polysilicon layers that are etched to form the core NMOS and PMOS gates. In addition to improving the profile control for the gate electrodes, various embodiments of the present invention can eliminate one to two masking steps from the overall fabrication sequence used to form the core transistor devices. While the etched core gate electrode structures 62, 64 at this stage have more vertical gate profiles, they must still be doped to set the work function and reduce poly depletion effects before the device is completed. This may be accomplished in accordance with various embodiments of the present invention by using the subsequent source/drain implantation steps to simultaneously implant the etched gate electrode structures 62, 64.

Figure 7:
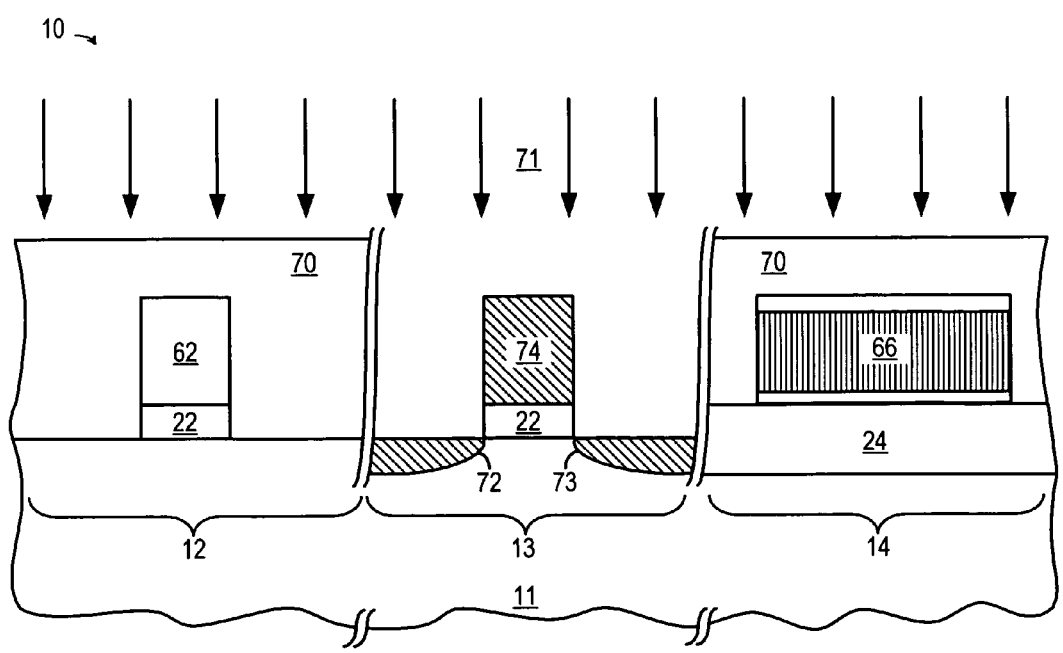
FIG. 7 illustrates processing subsequent to FIG. 6 after a first dopant mask is formed to expose a first core circuit area to permit the gate electrode structures and source/drain regions in the exposed first core circuit area to be simultaneously doped with a first doping implant step.

While any desired sequence of masking and implantation steps may be used to implant the gate, source and drain regions of the semiconductor structure 10, an illustrative sequence is described wherein the transistor features in the second circuit area 13 are selectively implanted, followed by selective implantation of the transistor features in the first circuit area 12. Beginning with FIG. 7, processing of the semiconductor structure 10 subsequent to FIG. 6 is illustrated after a first dopant mask 70 is formed to expose a second circuit area 13 using any desired patterning and etch sequence, including but not limited to depositing, patterning, etching or developing a photoresist or hard mask layer. Though the dopant mask 70 covering the first and third circuit areas 12, 14 may be formed from a single layer of photoresist, it is also contemplated that different masking materials may be used, such as, for example, using photoresist to mask the first circuit area 12 and using a nitride layer as a hard mask to block source/drain implants 71 from reaching the polysilicon-based device features 66 formed in the third circuit area 14.

With the implant mask 70 in place, a first doping implantation 71 simultaneously dopes the source/drain regions 72, 73 and gate electrode structures 74 in the exposed second circuit area 13 by implanting halo regions (not shown) and/or shallow extension regions 72, 73 around the etched gate stack structures 74 using conventional implanting processes to implant ions having a predetermined conductivity type. (Though not shown, halo and/or shallow extension regions may also be implanted around the etched gate stack structures 62 in the first circuit area 12 prior to sidewall spacer formation using a selective mask layer to expose the structures 62.) For example, when NMOS transistors are fabricated in the second circuit area 13, the gate electrode structures 74 and extension source/drain regions 72, 73 are simultaneously implanted 71 with arsenic or phosphorus, though other dopants could be used. In the first doping implantation 71, the implant dose may be adjusted or increased to compensate for the fact that the polysilicon layer 26 was not fully doped before etching, though as explained below, the polysilicon layer 26 may instead and/or in addition be doped with one or more deep source/drain implant steps that are performed after forming one or more sidewall spacers. In addition or in the alternative, a two-step implant can be included in the fabrication sequence to make up the doping required in the etched gate electrode structure 74. The gate electrode structures 74 and source/drain regions 72, 73 in the second circuit area 13 may be implanted very near the etched gate stack structures 74 through a thin sidewall spacer or liner oxide (not shown) formed on the etched gate stack structures 74 and exposed substrate 11 prior to implantation.

Figure 8:
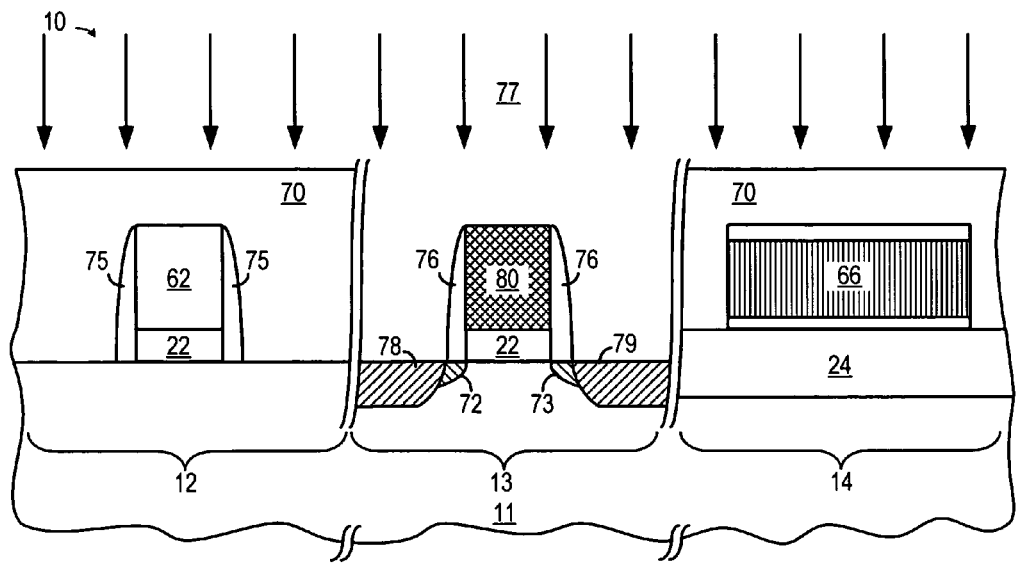
FIG. 8 illustrates processing subsequent to FIG. 7 after sidewall spacers are formed on the gate electrode structures, and at least a first source/drain implant is performed to simultaneously dope the gate electrode structures and exposed source/drain regions in the first core circuit area.

As illustrated in FIG. 8, the required gate poly doping may also be compensated with at least a first source/drain implantation 77 of ions for simultaneously implanting the gate electrode structure 80 and the exposed source/drain regions 78, 79 using sidewall spacers 75, 76 previously formed on the gate electrode structures 62, 80. The presence of the sidewall spacers 76 effectively pushes out the second doping implants 77 away from the channel below the gate electrode structure 80 to prevent the source/drain regions 78, 79 from overrunning the channel, thereby reducing or eliminating short channel effects. Prior to the implantation 77, the sidewall spacers 75, 76 may be formed by depositing one or more relatively thick dielectric layers (e.g., a 500 Angstrom layer of nitride) over the semiconductor structure 10 using any desired deposition process, and then anisotropically etching the deposited dielectric layer to form the sidewall spacers 75, 76. Depending on the constituent materials and dimensions of the deposited dielectric layer(s), the etching may use one or more anisotropic etch processes to form sidewall spacers 75, 76, including a dry etching process (such as reactive-ion etching, ion beam etching, plasma etching, laser etching), or any combination thereof. In a selected illustrative embodiment, the sidewall spacer processing details may be selected to obtain on each side a minimum predetermined total spacer width (e.g., approximately 200-700 Angstroms). Once the sidewall spacers 75, 76 are in place, deep source/drain regions 78, 79 may be formed by implanting the predetermined ions around the etched gate stack structures 80 and sidewall spacers 76, again using conventional implanting processes. For example, the source/drain regions 78, 79 may be formed as deep source/drain regions using the appropriate dopant where the dose is modified to make up the required dose in the gate electrode layer. In keeping with conventional processes, the implanted ions are annealed or heated to drive or diffuse the implanted ions into the substrate 11 to form the source/drain regions 78, 79.

As will be appreciated, other implantation sequences may be used to form the deep source/drain regions. In one such sequence, a second or additional set of sidewall spacers (not shown) are formed on the first sidewall spacers 75, 76 to offset a second additional source/drain implantation of ions (not shown) which is performed to set the polysilicon work function of the gate electrode structures 80 and thus prevent a very heavy effective S/D implant from overrunning the channel.

Figure 9:
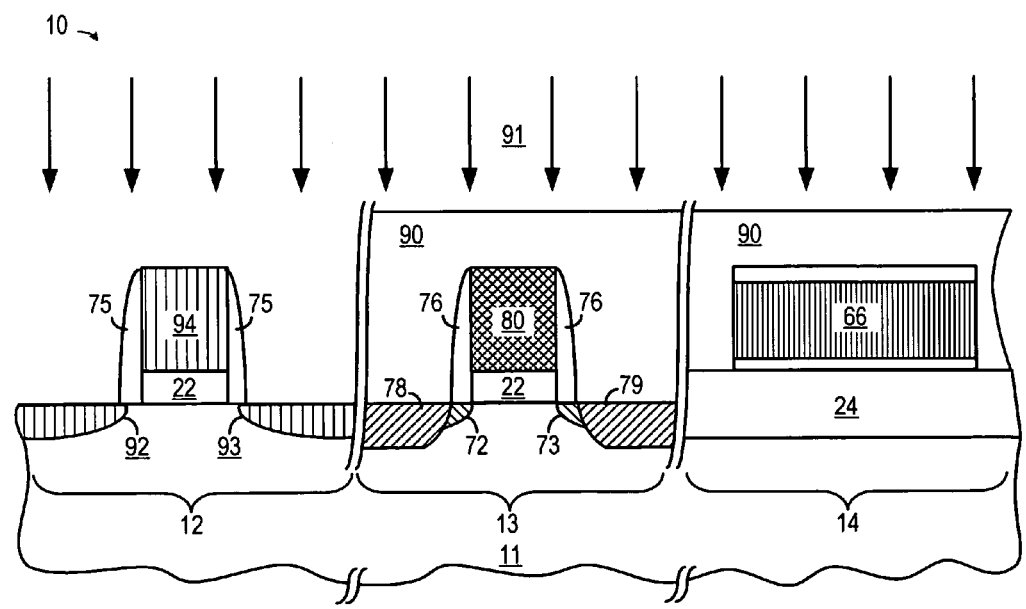
FIG. 9 illustrates processing subsequent to FIG. 8 after a second dopant mask is formed to expose a second core circuit area to permit the gate electrode structures and exposed source/drain regions in the exposed second core circuit area to be simultaneously doped with at least a second source/drain implant.
Figure 10:
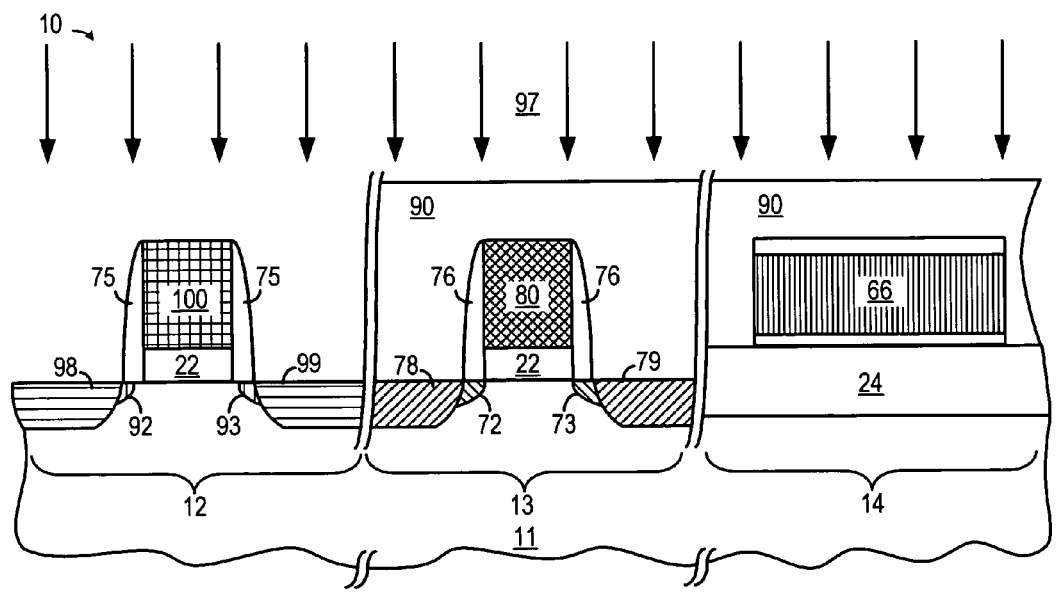
FIG. 10 illustrates processing subsequent to FIG. 9 after an additional doping implant step is performed to simultaneously dope the gate electrode structures and exposed source/drain regions in the second core circuit area.

After stripping the first dopant mask(s) 70, the foregoing sequence may be repeated to complete the transistor devices in the first circuit area 12. This is shown beginning with FIG. 9, which illustrates processing of the semiconductor structure 10 subsequent to FIG. 8 after a second dopant mask 90 is formed to expose the first circuit area 12. Though the dopant mask 90 covering the second and third circuit areas 13, 14 may be formed from a single layer of photoresist, it is also contemplated that different masking materials may be used, such as, for example, using photoresist to mask the second circuit area 13 and using a spacer nitride layer as a hard mask to block source/drain implants 91 from reaching the polysilicon-based device features 66 formed in the third circuit area 14. Next, at least a second source/drain implantation 91 simultaneously dopes the exposed (i.e., not covered by spacers 75) source/drain regions 92, 93 and gate electrode structures 94 using conventional implanting processes. For example, when PMOS transistors are fabricated in the first circuit area 12, the gate electrode structures 94 and exposed source/drain regions 92, 93 are simultaneously implanted 91 with boron, though other dopants could be used. Again, the source/drain implantation 91 may be adjusted or increased to make up the doping required in the etched gate electrode structure 94, such as by adjusting the dosage or using a two-step implant process. For example, the required gate poly doping may be compensated with an additional implantation 97 of ions for implanting the gate electrode structure 100 and exposed source/drain regions 98, 99, such as illustrated in FIG. 10. For example, the source/drain regions 98, 99 may be formed as P+ deep source/drain regions by implanting boron with an energy of approximately 5-25 keV (e.g., 5 keV) and with a dose of approximately $5 \times 10^{14}$ to $5 \times 10^{16}$ cm$^{-2}$ (e.g., $4 \times 10^{15}$ cm$^{-2}$). In keeping with conventional processes, the implanted ions are annealed or heated to drive or diffuse the implanted ions into the substrate 11 to form the source/drain regions 98, 99.

Figure 11:
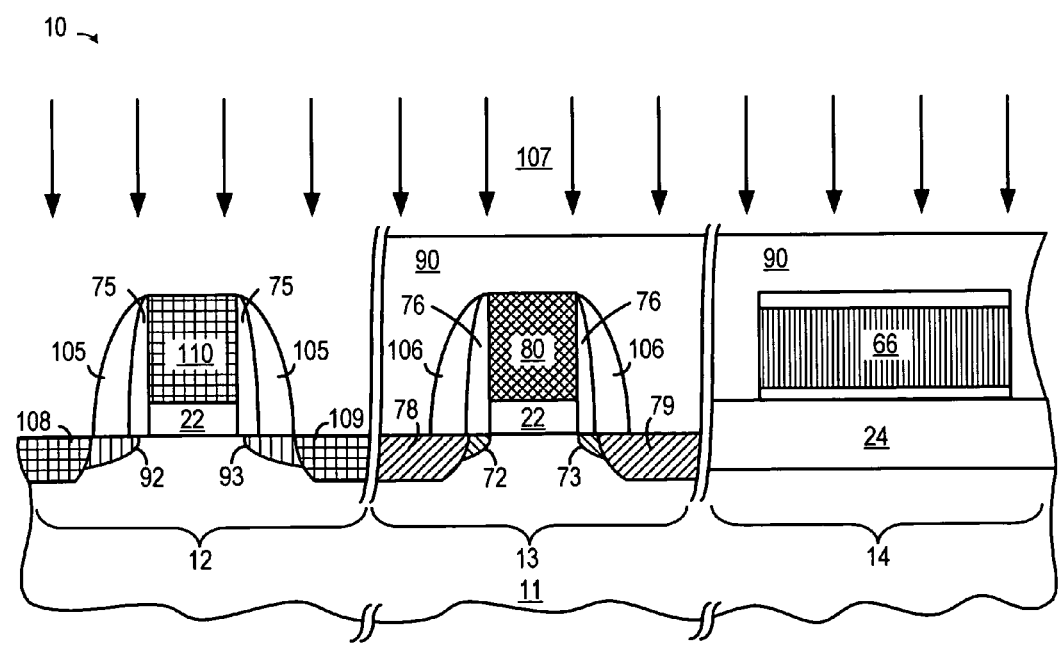
FIG. 11 illustrates processing in accordance with an alternate embodiment of the present invention whereby additional sidewall spacers are formed in order to offset the additional doping implant further away from the channel in the second core circuit area.

As mentioned above, other implantation sequences may be used to form the deep source/drain regions. One such exemplary sequence is depicted in FIG. 11 which illustrates processing of the semiconductor structure 10 subsequent to FIG. 9 in accordance with an alternate embodiment of the present invention whereby deep source/drain regions are formed with two separate implant steps, where the first implant 91 provides a portion of the doping required to set the work function of the gate electrode 110, and the second implant 107 provides the remaining required doping. As depicted, the additional sidewall spacers 105, 106 are formed on the first sidewall spacers 75, 76 after a first implantation 91 of the source/drain regions 92, 93 and prior to a second implantation 107. With the additional sidewall spacers 105 in place, the additional implant 107 is pushed out to prevent a very heavy effective S/D implant from overrunning the channel below the gate electrode 110. By using two separate implants and additional sidewall spacers for the second implant, the doping needed to set the polysilicon work function can be obtained while simultaneously implanting source/drain regions that do not overrun the channel.

Figure 12:
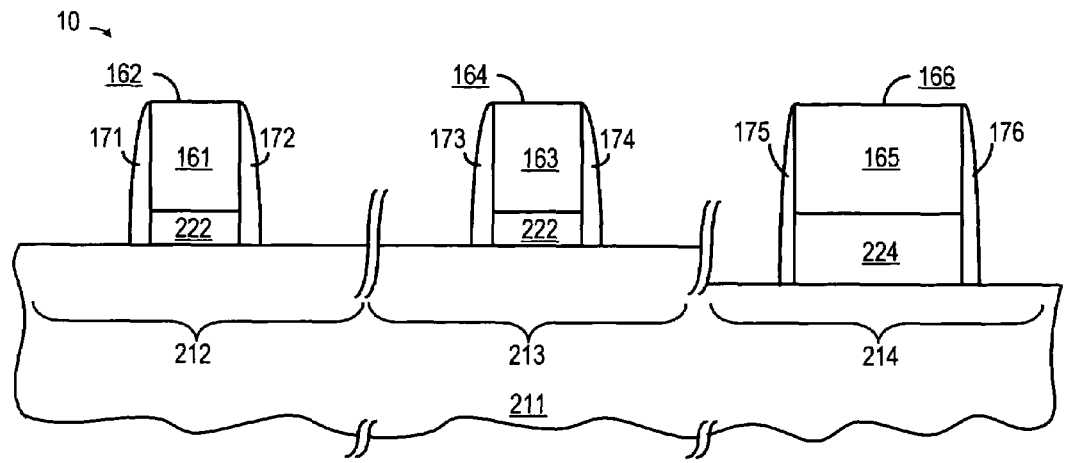
FIG. 12 illustrates processing subsequent to FIG. 2-3 after formation of first sidewall spacers on the etched and undoped gate electrode structures having vertical sidewall profiles, in accordance with selected alternative embodiments of the present invention.

In accordance with yet other embodiments of the present invention, undoped gates are etched to have vertical sidewall profiles, but are then selectively implanted with nitrogen and doped by tuning the source/drain implant to account for the presence of nitrogen in the source/drain regions. For example, FIG. 12 illustrates processing of the semiconductor structure 10 subsequent to FIG. 2-3 after formation of first sidewall spacers 171-174 on the sidewalls of the etched gate electrode structures 162, 164 in the core circuit areas 212, 213. Each etched gate electrode structure 162, 164 is formed with a conductive layer 161, 163 and gate dielectric layer 222 over the substrate 211. Having been etched from undoped polysilicon, the etched gate electrode structures 162, 164 have vertical sidewall profiles. In the non-core circuit areas 214, sidewall spacers 175, 176 may be formed on the non-core transistor gates 166 which include a conductive layer 165 formed over a dielectric layer 224.

Figure 13:
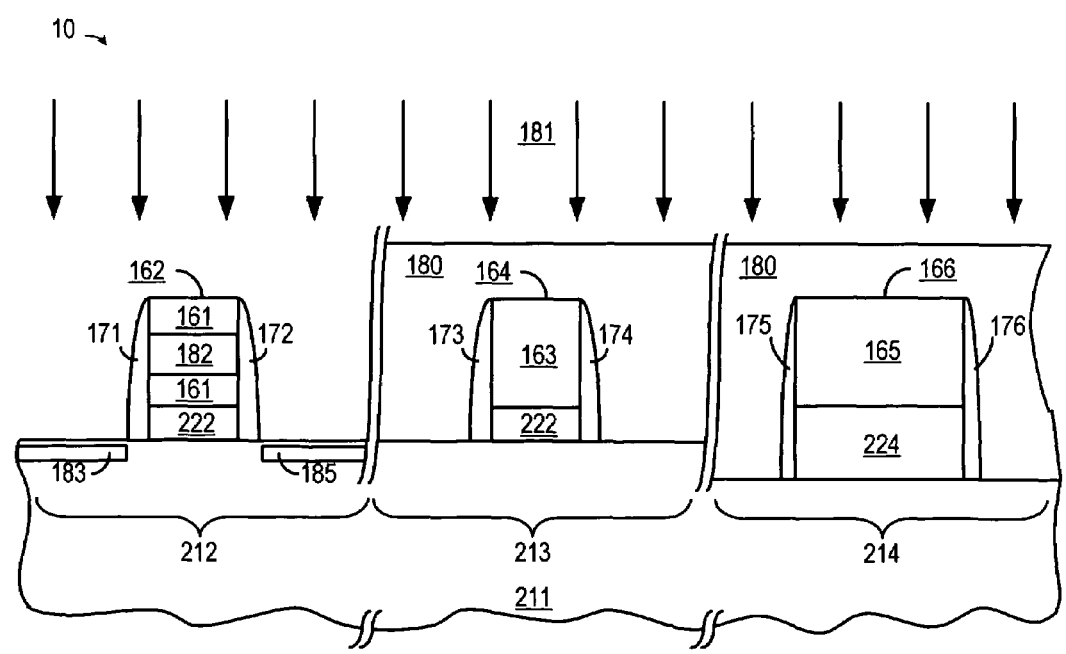
FIG. 13 illustrates processing subsequent to FIG. 12 after a mask is formed to expose etched and undoped gate electrode structures in a core circuit area which is implanted with an implant species, such as nitrogen.

FIG. 13 illustrates processing of the semiconductor structure 10 subsequent to FIG. 12 after a mask 180 is formed to expose etched and undoped gate electrode structures 162 in a core circuit area 212 which is implanted with a diffusion retardation species 181, such as nitrogen, xenon, germanium, etc. As will be appreciated, the mask 180 may expose a second core area 213 (if the core devices 164 are to be implanted) or a third circuit area 214 (if the non-core transistor gates 166 are to be implanted). Depending on the implant conditions, the concentration profile of the implanted species 181 will create a region 182 at a predetermined depth in the gate stack conductive layer 161 in which the implant species concentration peaks. When nitrogen is implanted, the peak nitrogen concentration depth may be located at or below the middle of the gate stack conductive layer 161 to help prevent boron penetration into the gate dielectric layer 222. As for the exposed substrate regions, the implanted species 181 will create nitrogen regions 183, 185 which are implanted into the substrate 211 around the sidewall spacers 171, 172.

Figure 14:
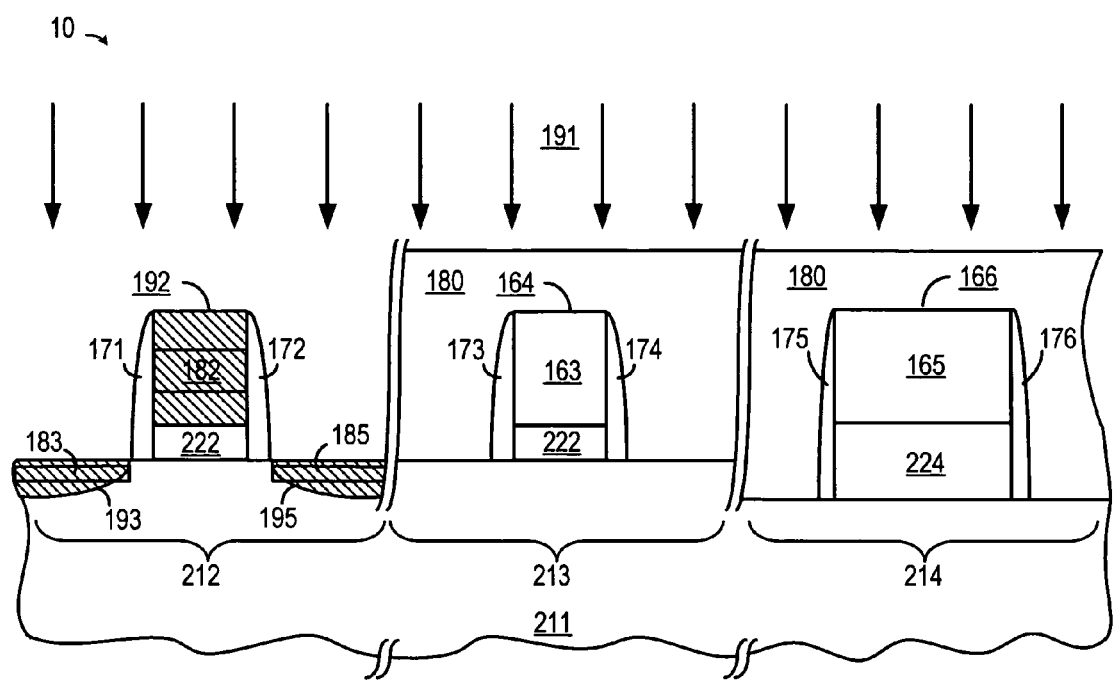
FIG. 14 illustrates processing subsequent to FIG. 13 after the core circuit area is implanted with a doping implant step to simultaneously dope the gate electrode structures and source/drain regions in the core circuit area.

FIG. 14 illustrates processing of the semiconductor structure 10 subsequent to FIG. 13 after the core circuit area 212 is implanted with a doping implant step 191 to simultaneously dope the gate electrode structures 192 and source/drain regions 193, 195 in the core circuit area 212. As explained above, the source/drain regions can be implanted using any desired implantation sequences, including one or more implants using any desired number of sidewall spacers. In addition, when nitrogen regions 183, 185 have previously been implanted into the source/drain areas, the doping implant step 191 (e.g., P+ boron S/D implant) may be tuned to account for the presence of nitrogen regions 183, 185 in the source/drain regions. In a selected embodiment, the dose and/or energy of the implant 191 may be increased by up to approximately 50% to account for there being less boron diffusion in the nitrogen-implanted source/drain regions. For example, the source/drain regions 193, 195 may be formed by implanting boron with an energy of approximately 7.5 keV and/or a dose of approximately $6 \times 10^{15}$ cm$^{-2}$, though different energies and doses can be used. As will be appreciated, additional sidewall spacers may also be used in connection with an additional source/drain implant to simultaneously dope the gate and source/drain areas with additional impurities in such a way that the additional source/drain implant will be spaced away from the channel area beneath the gate electrodes.

It will be appreciated that additional processing steps will be used to complete the fabrication of the gate electrodes into functioning transistors or devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the gate electrodes may vary, depending on the process and/or design requirements.

In one form, there is provided herein a method for fabricating a semiconductor device by forming a dielectric layer and an intrinsic or undoped layer (e.g., intrinsic polysilicon) over a semiconductor substrate, implanting the undoped layer with nitrogen and then selectively etching the undoped layer with an anisotropic etch process chemistry (e.g., a plasma etch) that is optimized to reduce hour-glassing associated with nitrogen-implanted polysilicon profiles, thereby forming a plurality of etched gates having implanted nitrogen and vertical sidewalls. In a selected embodiment, the anisotropic etch process chemistry eliminates profile differences between the plurality of etched gates by increasing an oxygen flow parameter and decreasing a CF4 flow parameter in a polysilicon etch chemistry. By reducing or eliminating the amount of pre-doping in the polysilicon layer, more vertical sidewall profiles may be obtained from a subsequent gate etch step. In addition to etching core device gates, additional polysilicon features may be formed for use as non-core devices (e.g., polysilicon resistors or input/output transistors having gate lengths that are larger than the gate lengths of the core NMOS or PMOS transistor devices) by selectively implanting a predetermined dopant species into the undoped layer in a predetermined circuit area to form a doped layer, and then selectively etching the doped layer to form etched polysilicon structures in the predetermined circuit area. Subsequent to etching, the gates in a first circuit area (e.g., core PMOS gates) are selectively implanted with a first dopant species (e.g., boron) during implantation of source/drain regions, and the gates in a second circuit area (e.g., core NMOS gates) are selectively implanted with a second dopant species (e.g., phosphorus) during implantation of source/drain regions. Selective implantation may be implemented with a first implant using a first set of sidewall spacers to simultaneously dope the etched gate and exposed source/drain regions, followed by a second implant using a second set of sidewall spacers to simultaneously dope the etched gate and form second source/drain regions in the substrate spaced apart from the vertical sidewalls of the etched gate by the first and second sidewall spacers. As will be appreciated, selective doping of the etched gates may be implemented by forming a photoresist or masking layer over the etched gates and then selectively etching an opening in the photoresist or masking layer over the first circuit area to expose the etched gates in the first circuit area.

In another form, a method for forming a semiconductor device is disclosed where an undoped or intrinsic polysilicon layer is formed on a dielectric layer over a substrate in first, second and third circuit areas. After a dopant is selectively implanted into the polysilicon in the third circuit area (e.g., where polysilicon resistors or non-core transistor gates are subsequently formed), the polysilicon is then selectively etched with an anisotropic plasma etch process, thereby forming a plurality of etched gates in the first and second circuit areas having substantially vertical sidewalls. Thereafter, the etched gates (e.g., in the first circuit area and/or second circuit area) are implanted with a dopant species to form a doped etched gates (such as etched gates used to form MOSFET transistor devices or FinFET transistor devices) while simultaneously implanting the substrate to form source/drain regions adjacent (e.g., self-aligned or spacer aligned) to the etched gates. In accordance with various embodiments, nitrogen may be implanted into the polysilicon layer before or after selectively etching the intrinsic polysilicon layer with an anisotropic etch process.

In yet another form, there is disclosed a method of fabricating a gate electrode. First, an undoped polysilicon layer is formed, and may be selectively implanted with dopants in a predetermined circuit area in which poly resistors or non-core devices are subsequently formed. The undoped polysilicon layer is then etched to form an etched gate electrode having substantially vertical sidewalls, and then sidewall implant spacers may be formed on the vertical sidewalls of the etched gate electrode. Subsequently, nitrogen is implanted into the etched gate electrode and any unprotected substrate region(s) before the etched gate electrode and the unprotected substrate region(s) are selectively implanted with a first dopant species to simultaneously dope the etched gate electrode and form first source/drain regions adjacent the etched gate electrode.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted transistor structures may also be formed in a well region (not shown) of the substrate which may be an n-doped well or a p-doped well. Also, the various silicon-based constituent layers may be formed with different conductive materials than those disclosed. In addition, the source and drains and extensions may be p-type or n-type, depending on the polarity of the underlying substrate or well region, in order to form either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. In selected embodiments, the disclosed profile control techniques improve yield by improving critical dimension control at the bottom of the gates, provide robust silicide formation at the top of the polysilicon layers, and extend existing silicide technologies to smaller dimensions. For example, when existing cobalt silicide layers are formed on polysilicon gate electrode layers, the increased silicide resistance that occurs below gate widths of 40 nm is avoided by using the undoped gate etch techniques disclosed herein to improve the gate electrode profiles. By extending the usefulness of existing cobalt silicide materials to smaller device geometries, the integration issues associated with newer silicide materials, such as nickel silicide (NiSi) encroachment, may also be avoided. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:

providing a semiconductor substrate;

forming a dielectric layer over the semiconductor substrate;

forming an undoped layer over the dielectric layer;

implanting nitrogen into the undoped layer;

selectively etching the undoped layer after implanting nitrogen with an anisotropic etch process chemistry, thereby forming a plurality of etched gates having implanted nitrogen and having substantially vertical sidewalls;

selectively implanting a first etched gate and the substrate in a first circuit area with a first dopant species to simultaneously dope the first etched gate and form first source/drain regions; and selectively implanting a second etched gate and the substrate in a second circuit area with a second dopant species to simultaneously dope the second etched gate and form second source/drain regions.

2. The method of claim 1, further comprising selectively implanting a third dopant species into the undoped layer in a third circuit area to form a doped layer prior to selectively etching said doped layer.

3. The method of claim 2, where the first etched gate in the first circuit area is used to form a core PMOS transistor, the second etched gate in the second circuit area is used to form a core NMOS transistor, and the doped layer in the third circuit area is used to form a transistor having a gate length that is larger than a gate length of the core PMOS transistor or core NMOS transistor.

4. The method of claim 1, where the anisotropic etch process chemistry comprises flowing between about 8 sccm and 12 sccm of $O_2$ and between about 8 sccm and 12 sccm of $CF_4$ into a processing chamber.

5. The method of claim 1, where selectively etching comprises a plasma etch process.

6. The method of claim 2, where polysilicon resistors are formed in the third circuit area by selectively etching the doped layer.

7. The method of claim 2, where input/output transistors are formed by selectively etching the doped layer in the third circuit area.

8. The method of claim 1, where selectively implanting a first etched gate comprises:
forming first sidewall spacers on the vertical sidewalls of the first etched gate; and
using a first implant which dopes the first etched gate and forms first source/drain regions in exposed regions of the substrate.

9. The method of claim 1, where selectively implanting a first etched gate comprises:
forming first sidewall spacers on the vertical sidewalls of the first etched gate;
using a first implant which dopes the first etched gate and forms first source/drain regions in exposed regions of the substrate;
forming second sidewall spacers on the first sidewall spacers; and
using a second implant which dopes the first etched gate and forms second source/drain regions in the substrate spaced apart from the vertical sidewalls of the first etched gate by the first and second sidewall spacers.

10. The method of claim 1, where the undoped layer comprises a layer of undoped polysilicon.

11. A method for forming a semiconductor device, comprising:
forming a dielectric layer over a semiconductor substrate;
forming an undoped polysilicon layer over the dielectric layer in first, second and third circuit areas;
selectively implanting a predetermined dopant species into the undoped polysilicon layer in the third circuit area;
selectively etching the polysilicon layer with an anisotropic etch process chemistry to form a plurality of etched gates in the first and second circuit areas, said etched gates having substantially vertical sidewalls;
selectively implanting a first etched gate and the substrate in the first circuit area with a first dopant species to simultaneously dope the first etched gate and form first source/drain regions;
selectively implanting a second etched gate and the substrate in the second circuit area with a second dopant species to simultaneously dope the second etched gate and form second source/drain regions.

12. The method of claim 11, where the plurality of etched gates are used to form MOSFET transistor devices.

13. The method of claim 11, where the plurality of etched gates are used to form FinFET transistor devices.

14. The method of claim 11, where selectively implanting a first etched gate comprises:
forming first sidewall spacers on the sidewalls of the first etched gate;
using a first implant which dopes the first etched gate and forms first source/drain regions in exposed regions of the substrate;
forming second sidewall spacers on the first sidewall spacers; and
using a second implant which dopes the first etched gate and forms second source/drain regions in the substrate spaced apart from the vertical sidewalls of the first etched gate by the first and second sidewall spacers.

15. The method of claim 11, where the anisotropic etch process comprises a plasma etch process.

16. The method of claim 11, further comprising implanting nitrogen into the undoped polysilicon layer in the first and second circuit areas before selectively etching the polysilicon layer.

17. The method of claim 11, further comprising selectively implanting nitrogen into the undoped polysilicon layer in the first circuit area after selectively etching the polysilicon layer.

18. A method of fabricating a gate electrode, comprising:
selectively etching an undoped polysilicon layer in a first predetermined circuit area to form an etched gate electrode having substantially vertical sidewalls;
implanting nitrogen into the etched gate electrode and any unprotected substrate regions; and
selectively implanting the etched gate electrode and the unprotected substrate regions with a first dopant species to simultaneously dope the etched gate electrode and form first source/drain regions in the substrate adjacent the etched gate electrode.

19. The method of claim 18, further comprising:
selectively implanting a predetermined dopant species into the undoped polysilicon layer in a second predetermined circuit area prior to selectively etching the undoped polysilicon layer; and
selectively etching the polysilicon layer in the second predetermined circuit area to form polysilicon resistors or non-core transistor gates.

20. The method of claim 18, further comprising forming sidewall spacers on the vertical sidewalls of the etched gate electrode prior to implanting nitrogen into the etched gate electrode.

* * * * *